(12) United States Patent
Matsuda et al.

(10) Patent No.: US 12,166,497 B2
(45) Date of Patent: Dec. 10, 2024

(54) POWER CONVERSION DEVICE

(71) Applicant: Mitsubishi Electric Corporation, Tokyo (JP)

(72) Inventors: Atsushi Matsuda, Tokyo (JP); Satoshi Ojika, Tokyo (JP); Tomokazu Sakashita, Tokyo (JP); Shinichiro Oikawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 230 days.

(21) Appl. No.: 17/923,231

(22) PCT Filed: Jun. 30, 2020

(86) PCT No.: PCT/JP2020/025637
§ 371 (c)(1),
(2) Date: Nov. 4, 2022

(87) PCT Pub. No.: WO2022/003812
PCT Pub. Date: Jan. 6, 2022

(65) Prior Publication Data
US 2023/0188151 A1    Jun. 15, 2023

(51) Int. Cl.
*H03M 1/12* (2006.01)
*H03M 1/00* (2006.01)

(52) U.S. Cl.
CPC ......... *H03M 1/1255* (2013.01); *H03M 1/002* (2013.01); *H03M 1/1225* (2013.01)

(58) Field of Classification Search
CPC .. H03M 1/1255; H03M 1/002; H03M 1/1225; H02M 1/32

(Continued)

(56) References Cited

U.S. PATENT DOCUMENTS 6,075,478 A * 6/2000 Abe ...................... H03M 1/002
                                                        341/155
10,491,126 B1* 11/2019 Pastore ............. H02M 3/33523
(Continued)

FOREIGN PATENT DOCUMENTS

JP    2006-166623 A    6/2006
JP    2006-333379 A    12/2006
(Continued)

OTHER PUBLICATIONS

International Search Report and Written Opinion mailed on Sep. 29, 2020, received for PCT Application PCT/JP2020/025637, filed on Jun. 30, 2020, 10 pages including English Translation.

*Primary Examiner* — Jean B Jeanglaude
(74) *Attorney, Agent, or Firm* — XSENSUS LLP (57) ABSTRACT

N (n is a natural number) power converters operate in accordance with a drive signal to generate a power to be supplied to a load. Multi-redundant A/D converters convert an analog detection value from the power converters into digital values. First and second controllers operate in parallel and each generate a drive signal of the power converters using the digital values from the A/D converters. A system selector selects one controller in accordance with an abnormality detection result of the first and second controllers. Each of n output selectors receives the drive signals from both of the first and second controllers and outputs the drive signal from the one controller selected by the system selector to the power converters.

8 Claims, 7 Drawing Sheets

(58) Field of Classification Search
USPC .......................................................... 341/155
See application file for complete search history.

(56) References Cited

U.S. PATENT DOCUMENTS

| | | |
|---|---|---|
| 2016/0134212 A1 | 5/2016 | Kikuchi et al. |
| 2021/0226574 A1 | 7/2021 | Kimura et al. |

FOREIGN PATENT DOCUMENTS

| | | |
|---|---|---|
| JP | 2015-2634 A | 1/2015 |
| JP | 2018-33228 A | 3/2018 |
| JP | 2019-161994 A | 9/2019 |

* cited by examiner

POWER CONVERSION DEVICE

CROSS-REFERENCE TO RELATED APPLICATION

The present application is based on PCT filing PCT/JP2020/025637, filed Jun. 30, 2020, the entire contents of which are incorporated herein by reference.

TECHNICAL FIELD

The present disclosure relates to a power conversion device.

BACKGROUND ART

A redundant configuration having identical devices arranged in parallel for backup is used to continue operation at occurrence of a failure. As an example of the redundant configuration, Japanese Patent Laying-Open No. 2006-166623 (PTL 1) describes a drive system for a dual-redundant motor with arrangement of first and second redundant drive windings.

In the configuration in PTL 1, a first drive circuit and a first control circuit that controls the first drive circuit are arranged for the first redundant drive winding, and a second drive circuit and a second control circuit that controls the second drive circuit are arranged for the second redundant drive winding. Further, a rotation detecting sensor is arranged in a triple-redundant system, and first to third sensor signals of the triple redundant system are input to each of the first control circuit and the second control circuit.

CITATION LIST

Patent Literature

PTL 1: Japanese Patent Laying-Open No. 2006-166623

SUMMARY OF INVENTION

Technical Problem

In applications such as artificial satellites having limitations to repair at occurrence of a failure, a redundant configuration is applied to a power conversion device for supplying a power to a device (load). To apply the technique in PTL 1 to such a redundant configuration, a configuration in which a plurality of power converters are provided in parallel may be applied to the same load, in the same manner as the redundant drive windings.

However, in the configuration in PTL 1, the drive circuit and the controller are provided at a ratio of 1:1 for each of a plurality of redundant drive windings to configure the redundant system. In the power conversion device employing PTL 1, therefore, the controllers are arranged at 1:1 for a plurality of power converters. In such a configuration, when a failure occurs in any one of the controllers, the corresponding power converter may become unavailable even if it does not fail. Therefore, there is a concern that the redundancy of the controllers is unable to be ensured efficiently.

As the number of redundancy of power converters is increased, the number of controllers arranged is also increased equally. Thus, there is a concern that the increase of the number of controllers leads to increase of the number of components. Usually, it is desired to minimize the number of components of the redundant configuration in terms of circuit scale, cost, and reliability. The configuration in PTL 1 therefore does not ensure the redundancy efficiently also in view of the number of controllers arranged.

The present disclosure is made to solve such problems and an object of the present disclosure is to provide a configuration of a power conversion device for ensuring the redundancy efficiently.

Solution to Problem

In an aspect of the present disclosure, a power conversion device includes n (n is a natural number equal to or greater than 1) power converters, a signal converter, first and second controllers operating in parallel, a system selector, and n output selectors. The power converters each operate in accordance with a drive signal and generate a power to be supplied to a load. The signal converter has a redundant configuration in which L (L is a natural number equal to or greater than 3) analog-to-digital converters to convert an analog detection value from the power converters into digital values are arranged in parallel. Each of the first and second controllers generates the drive signal using the digital values from the analog-to-digital converters. The system selector selects one of the first and second controllers in accordance with an abnormality detection result of the first and second controllers. The n output selectors are provided corresponding to the n power converters, respectively. Each of the output selectors receives the drive signals from both of the first and second controllers and outputs the drive signal from one controller selected by the system selector from the first and second controllers, to one corresponding power converter among the n power converters.

Advantageous Effects of Invention

According to the present disclosure, the dual-redundant first and second controllers operate in parallel so that the operation of normal power converters can be continued, irrespective of the number of constituent power converters, using the other controller in case of a failure of one of the first and second controllers, thereby ensuring the redundancy efficiently.

DESCRIPTION OF EMBODIMENTS

Embodiments of the present disclosure will be described in detail below with reference to the drawings. In the following, like or corresponding parts in the drawings are denoted by like reference signs and a description thereof is basically not repeated.

First Embodiment

Figure 1:
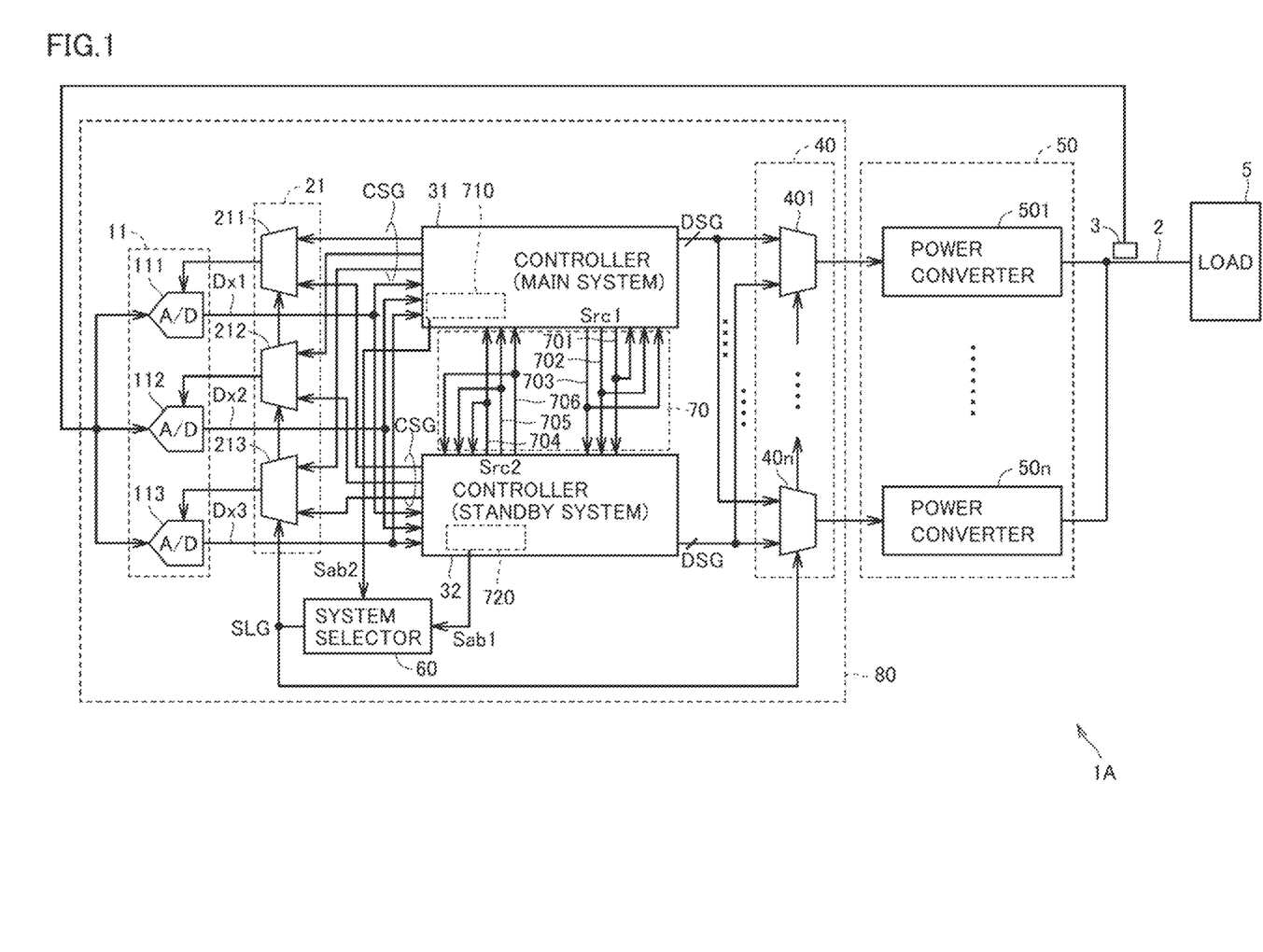
FIG. 1 is a block diagram illustrating a configuration of a power conversion device according to a first embodiment of the present disclosure.

FIG. 1 is a block diagram illustrating a configuration of a power conversion device according to a first embodiment of the present disclosure.

Referring to FIG. 1, a power conversion device 1A according to the first embodiment includes n (n is a natural number equal to or greater than 2) power converters 501 to 50n, and a control device 80. Typically, one redundant power converter is added to (n−1) power converters to ensure N+1 redundancy in which power converters 501 to 50n are arranged more than the required number for essential power supply. In the following, power converters 501 to 50n may be collectively referred to simply as power converter 50. Each of power converters 501 to 50n has the same configuration and function and is composed of, for example, a DC-DC converter, inverter, or the like that performs power conversion by on/off control of switching elements (not shown) such as transistors.

Power converters 501 to 50n are connected in parallel to a load 5 through a power bus 2. Therefore, the sum of output powers from power converters 501 to 50n operating in parallel is supplied to load 5 through power bus 2. Load 5 is composed of, for example, on-board devices (communication device, attitude control device, propulsion device, observation device, etc.) of an artificial satellite. In such an application, the importance of the redundant configuration is higher because repair and replacement is extremely difficult. However, it should be noted that the power conversion device according to the present embodiment can be used for power supply to any load 5.

A sensor 3 for detecting current or voltage is arranged on power bus 2. A detection value by sensor 3 is set as a control target value and input to control device 80. For example, control device 80 generates a drive signal DSG of power converter 50 for controlling the detection value changing with output from power converter 50 to a target value determined separately.

Control device 80 includes a triple-redundant A/D converter 11, dual-redundant controllers 31 and 32, triple-redundant control selector 21 for selecting a control signal from controllers 31 and 32, an output selector 40 for selecting drive signal DSG from controllers 31 and 32, and a system selector 60 for switching selection between controllers 31 and 32. Output selector 40 is composed of n output selectors 401 to 40n as many as power converters 501 to 50n. Output selectors 401 to 40n may also be collectively referred to simply as output selector 40.

Controllers 31 and 32 that constitute dual redundancy have the same function and operate in parallel to generate identical drive signals DSG. Typically, each of controllers 31 and 32 is composed of an operation processing circuit such as a field programmable gate array (FPGA) or a microcontroller. One of controllers 31 and 32 is set as a main system and the other is set as a standby system, as will be described later. Controllers 31 and 32 correspond to "first controller" and "second controller".

Controller 31 includes an abnormality detector 710 as a function, and controller 32 includes an abnormality detector 720 as a function. In the present embodiment, an example in which controllers 31 and 32 mutually monitor abnormality by exchanging rectangular wave signals through a triple-redundant abnormality detection signal line 70 will be described. The detail of abnormality detection will be described later. As a result, an abnormality detection signal for controller 31, 32 is output from abnormality detector 710, 720 to system selector 60.

An analog voltage that is a detection value of sensor 3 is input in parallel to triple-redundant A/D converters 111 to 113. In the following, A/D converters 111 to 113 may be collectively referred to simply as A/D converter 11. The minimum number of A/D converters 11 provided for the same analog detection value is three, but the number of redundancy may be increased to four or more. When the number of redundancy of A/D converter 11 is L (L is a natural number equal to or greater than 3), A/D converter 11 formed with L A/D converters 111 to 11L (L=3 in FIG. 1) corresponds to an embodiment of "signal converter".

A/D converters 111 to 113 respectively output digital values Dx1 to Dx3 produced by digitally converting the analog detection value. Digital values Dx1 to Dx3 are input to each of controllers 31 and 32. As described above, digital values Dx1 to Dx3 indicate control target values such as output voltage, output current, and the like of power converter 50. Each of controllers 31 and 32 performs any control operation process such as feedback control, feed forward control, and neural network control using digital values from A/D converter 11. With this control operation process, drive signal DSG for controlling the operation of power converter 50 is generated.

Specifically, drive signal DSG corresponds to an on/off control signal of the above switching elements (not shown) included in power converters 501 to 50n. For example, drive signal DSG can be composed of a pulse width modulation (PWM) signal for matching a control target value with a target value. As a result, power converter 50 operates in accordance with drive signal DSG from control device 80 so that the control target value such as output current or output voltage can be controlled to the target value. That is, power converters 501 to 50n can operate with drive signal DSG generated by controller 31 or 32, in a manner common to these power converters.

Drive signals DSG output from dual-redundant controllers 31 and 32 are temporarily input to each of output selectors 401 to 40n. Each of output selectors 401 to 40n outputs one of drive signal DSG from controller 31 and drive signal DSG from controller 32 to power converters 501 to 50n, in accordance with a select signal SLG from system selector 60. Each of output selectors 401 to 40n can be composed of a multiplexer.

Each of controllers 31 and 32 further generates control signal CSG of A/D converter 11. Control signal CSG is, for example, a signal for controlling a conversion process (for example, conversion rate) in each of A/D converters 111 to 113.

Control signals CSG of A/D converters 111 to 113 from dual-redundant controllers 31 and 32 are temporarily input to control selectors 211 to 213, respectively. Control selectors 211 to 213 output one of control signal CSG from controller 31 and control signal CSG from controller 32 to A/D converters 111 to 113, in accordance with select signal SLG from system selector 60. Each of control selectors 211 to 213 can be composed of a multiplexer.

Control selectors 211 to 213 may also be collectively referred to simply as control selector 21. In the configuration example in FIG. 1, control selectors 211 to 213 that constitute control selector 21 are provided as many as A/D converters 111 to 113. The number of multiplexers that constitute control selector 21 therefore changes with the number of redundancy (L) of A/D converter 11.

System selector 60 generates select signal SLG for selecting one of controllers 31 and 32. One of controllers 31 and 32 that is selected by select signal SLG is the controller of "main system", and the other controller is the controller of "standby system". In the following, by default, controller 31 is the main system, and controller 32 is the standby system.

Controllers 31 and 32 operate in parallel using digital values from A/D converter 11 in common to generate similar drive signals DSG, but only the drive signal DSG generated by the controller (for example, controller 31) selected as "main system" is input to power converters 501 to 50n.

Similarly, both of controllers 31 and 32 generate control signals CSG of A/D converter 11, but only the control signal CSG generated by the controller (for example, controller 31) selected as "main system" is input to A/D converters 111 to 11n.

Figure 2:
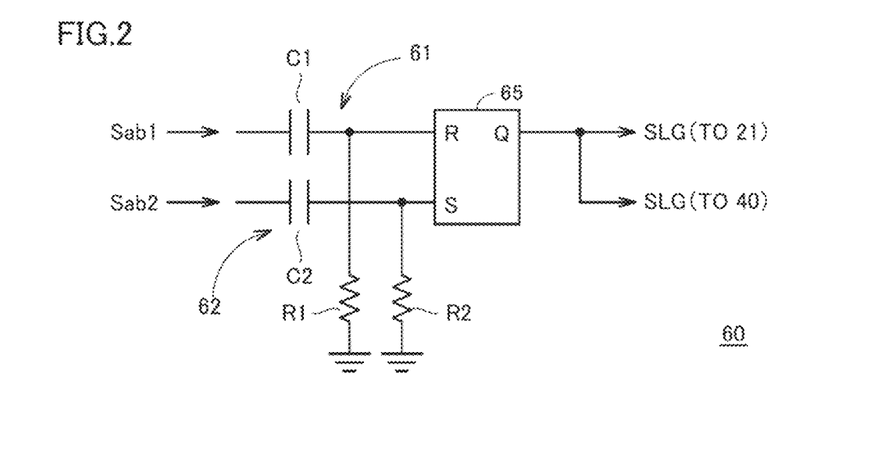
FIG. 2 is a circuit diagram showing a configuration example of a system selector shown in FIG. 1.

FIG. 2 is a circuit diagram illustrating a configuration example of system selector 60.

Referring to FIG. 2, system selector 60 generates select signal SLG illustrated in FIG. 1, based on an abnormality detection signal Sab1 of controller 31 and an abnormality detection signal Sab2 of controller 32. Abnormality detection signal Sab1, Sab2 is a binary signal generated by abnormality detector 710, 720. In the present embodiment of mutual abnormality monitoring, abnormality detection signal Sab1 is generated by abnormality detector 720, and abnormality detection signal Sab2 is generated by abnormality detector 710. Abnormality detection signal Sab1 is set to "0" when controller 31 is normal (when abnormality is not detected) and changes from "0" to "1" when abnormality of controller 31 is detected. Similarly, abnormality detection signal Sab2 is set to "0" when controller 32 is normal (when abnormality is not detected) and changes from "0" to "1" when abnormality of controller 32 is detected.

System selector 60 may be composed of a combination of edge detection circuits 61 and 62 and a latch circuit 65. For example, as shown in FIG. 2, edge detection circuit 61 that detects a transition between "0" and "1" of abnormality detection signal Sab1 can be composed of a CR differential circuit including a capacitor C1 and a resistor R1. Similarly, edge detection circuit 62 that detects a transition between "0" and "1" of abnormality detection signal Sab2 can be composed of a CR differential circuit including a capacitor C2 and a resistor R2.

Latch circuit 65 can be composed of a reset set flip flop (RS-FF). An output signal from edge detection circuit 61 is input to the reset (R) terminal of the RS-FF, and an output signal from edge detection circuit 62 is input to the set (S) terminal of the RS-FF. Select signal SLG is output from the Q terminal of the RS-FF. The default value of select signal SLG is "1", and when SLG="1", controller 31 is selected as "main system" whereas when SLG="0", controller 32 is selected as "main system".

When controllers 31 and 32 are normal, both of abnormality detection signals Sab1 and Sab2 are kept at "0", so "0" is input to the R terminal and the S terminal, and select signal SLG of the Q terminal is held. Thus, select signal SLG is kept to the default value "1", and controller 31 is set as the controller of "main system" while controller 32 is set as the controller of "standby system".

In this case, each of output selectors 401 to 40n outputs drive signal DSG from controller 31 to power converters 501 to 50n, in response to select signal SLG="1". Similarly, each of control selectors 211 to 213 outputs control signal CSG from controller 31 to A/D converters 111 to 113, in response to select signal SLG="1".

When abnormality of controller 31 is detected in a state of Sab1="0" and Sab2="0" and Sab1 changes from "0" to "1", "1" is input to the R terminal, so that select signal SLG of the Q terminal is reset to "0". In response, subsequently, controller 32 is selected as the controller of "main system" while controller 31 is selected as the controller of "standby system".

In this case, each of output selectors 401 to 40n outputs drive signal DSG from controller 32 to power converters 501 to 50n, in response to select signal SLG="0". Similarly, each of control selectors 211 to 213 outputs control signal CSG from controller 32 to A/D converters 111 to 113, in response to select signal SLG="0".

When abnormality of controller 32 is detected and Sab2 changes from "0" to "1", "1" is input to the S terminal, so that select signal SLG of the Q terminal is set to "1". In response, subsequently, the selection of controller 31 as the controller of "main system" and controller 32 as the controller of "standby system" is fixed.

Because of the provision of edge detection circuits 61 and 62, the switching between the main system and the standby system by system selector 60 is performed at a timing when the level of abnormality detection signal Sab1, Sab2 changes. Thus, even when the value of an abnormality detection signal (for example, Sab2) corresponding to the controller (for example, controller 32) of the standby system is erroneously fixed to "1" due to a failure of a signal output terminal or the like, the value of select signal SLG can be switched (for example, from "1" to "0") when abnormality occurs in the controller (for example, controller 31) of the main system and an abnormality detection signal (for example, Sab1) changes from "0" to "1". Even such a case, the main system and the standby system can be switched normally.

In this way, with the configuration in FIG. 1 and FIG. 2, in power conversion device 1A according to the first embodiment, dual-redundant controllers 31 and 32 operate in parallel, so that even if a single failure occurs in one of controllers 31 and 32, the other controller is set as "main system" and all of power converters 50 can continue operation irrespective of the number of constituent power converters 50. This configuration avoids a case where a power converter not having a failure becomes unavailable due to a failure of a controller, thereby ensuring the redundancy efficiently.

Even if a single failure occurs in output selectors 401 to 40n or power converters 501 to 50n, a desired power supply to load 5 can be continued with the configuration of N+1 redundancy.

Furthermore, in power conversion device 1A according to the first embodiment, N+1 redundant power converters 50 can be configured without providing controllers at a ratio of 1:1 to the power converters, specifically, a redundant system for controlling three or more power converters can be formed with arrangement of dual-redundant controllers 31 and 32 at minimum. This configuration can ensure the redundancy efficiently without incurring increase of the number of components due to increase of the number of controllers.

In case where system selector 60 is failed, the selection of "main system" and "standby system" by select signal SLG is fixed. Therefore, in case of a single failure of system selector 60, abnormality is not occurring in controllers 31 and 32, and therefore, a desire power supply to load 5 by power converter 50 can be continued.

Furthermore, the arrangement of control selector 21 ensures the redundancy with controllers 31 and 32 similarly even for a configuration in which the conversion process in A/D converter 11 is controlled from the controller side. In this respect, in the configuration in PTL 1, three converted values obtained by three RD converters converting three sensor signals from the rotation detecting sensor that constitutes the triple-redundant system are input to each of the first controller and the second controller, hue the configuration in which the conversion process in three RD converters is controlled from the controller side is not contemplated.

Figure 3:
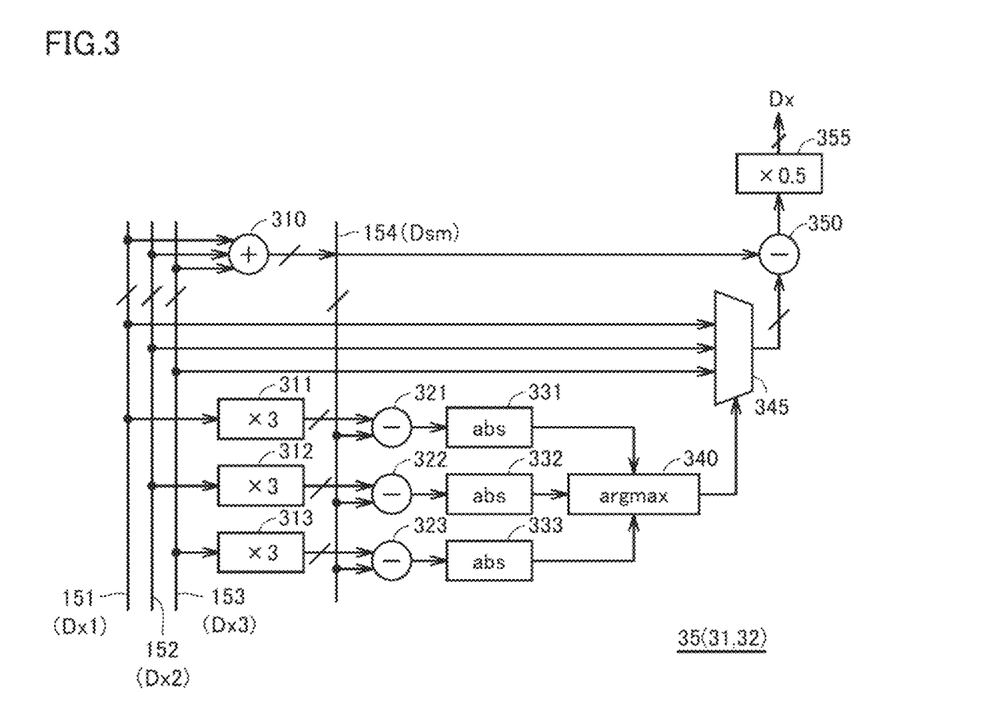
FIG. 3 is a circuit diagram illustrating a configuration of a processing system for a detection signal from an A/D converter in each controller shown in FIG. 1.

Referring now to FIG. 3, a processing system for output signals of triple-redundant A/D converter 11 in each of controllers 31 and 32 in power conversion device 1A according to the first embodiment will be described.

Referring to FIG. 3, a signal processing system 35 is included in each of controllers 31 and 32 as a part of the function of controllers 31 and 32.

Signal processing system 35 includes signal lines 151 to 154, an adder 310, multipliers 311 to 313 and 355, subtractors 321 to 323 and 350, absolute value calculators 331 to 333, a maximum value extractor 340, and a selector 345.

Signal lines 151 to 153 respectively transmit digital values Dx1 to Dx3 output from triple-redundant A/D converters 111 to 113. Adder 310 outputs a sum value Dsm of digital values Dx1 to Dx3 to signal line 154.

Multipliers 311 to 313 respectively output values obtained by multiplying digital values Dx1 to Dx3 by three. Subtractors 321 to 323 respectively output values obtained by subtracting the output values of multipliers 311 to 313 from sum value Dsm. Absolute value calculators 331 to 333 output the absolute values of the output values of subtractors 321 to 323. That is, absolute value calculator 331 outputs |Dsm−3·Dx1|, absolute value calculator 332 outputs |Dsm−3·Dx2|, and absolute value calculator 333 outputs |Dsm−3·Dx3|.

Maximum value extractor 340 extracts the maximum value among the output values of absolute value calculators 331 to 333. Thus, one digital value with the largest difference (the absolute value of difference) from the average value (Dsm/3) is extracted equivalently as an abnormal value from among digital values Dx1 to Dx3. For example, when |Dsm−3·Dx1| is greater than both of |Dsm−3·Dx2| and |Dsm−3·Dx3|, digital value Dx1 is extracted as an abnormal value.

Selector 345 outputs one of digital values Dx1 to Dx3 as an abnormal value, in accordance with the extraction result by maximum value extractor 340. Subtractor 350 outputs a value obtained by subtracting a digital value (abnormal value) output from selector 345 from sum value Dsm. Multiplier 355 multiplies the output value of the subtractor by 0.5 (½) and outputs digital value Dx to be used for the control operation process in controller 31, 32.

As a result, when digital value Dx1 is an abnormal value, Dx=(Dx2+Dx3)/2, when digital value Dx2 is an abnormal value, Dx=(Dx1+Dx3)/2, and when digital value Dx3 is an abnormal value, Dx=(Dx1+Dx2)/2. That is, digital value Dx corresponds to the average value of two digital values with a smaller difference from the average value that are extracted from digital values Dx1 to Dx3.

As a result, even when a single failure occurs in A/D converters 111 to 113 or control selectors 211 to 213, a digital value related to the A/D converter or the control selector suffering the single failure is eliminated as an abnormal value, and digital value Dx indicating the detection value of sensor 3 to be used in controller 31, 32 can be determined normally. As a result, with the control of power converter 50 by controller 31 or 32, a desired power supply to load 5 by power converter 50 can be continued.

In this case, the digital value (detection value) Dx to be used in controller 31, 32 is determined as the average value of digital values excluding an abnormal value, whereby the resolution of the sensor detection value can be increased equivalently. Ideally, the output values (digital values) of A/D converters 111 to 113 are the same for the same detection value by sensor 3. In this case, the output value of subtractor 350 is fixed to an evert-numbered value obtained by multiplying the same value by two. However, in actuality, due to quantization error, noise, and the like in A/D conversion, the output values of A/D converters 111 to 113 are not necessarily the same even though the abnormal value is removed. In such a case, the resolution of digital value (detection value) Dx is increased.

The signal processing for determining digital value Dx to be used in the control operation process from digital values Dx1 to Dx3 shown in FIG. 3 may be implemented by software processing by execution of a program. In the present embodiment, the configuration in which the number of redundancy L of A/D converter 11 is three is illustrated by way of example. However, digital value Dx can be calculated similarly when L≥4. In this case, digital value Dx can be calculated by extracting, from L digital values, two or more and (L−1) or less digital values with a smaller difference from the average value of L digital values and obtaining the average value of the extracted digital values. That is, the resolution can be increased up to (L−1) times.

An example of abnormality monitoring of controllers 31 and 32 will now be described.

Referring to FIG. 1 again, dual-redundant controllers 31 and 32 mutually monitor abnormality and send an abnormality detection signal to system selector 60 when detecting abnormality. For example, abnormality detection is performed using rectangular wave signals generated in controllers 31 and 32.

Controller 31 outputs the generated rectangular wave signal Src1 to triple-redundant signal lines 701 to 703. Rectangular wave signal Src1 output to signal lines 701 to 703 is input to both of controllers 32 and 31.

Figure 4:
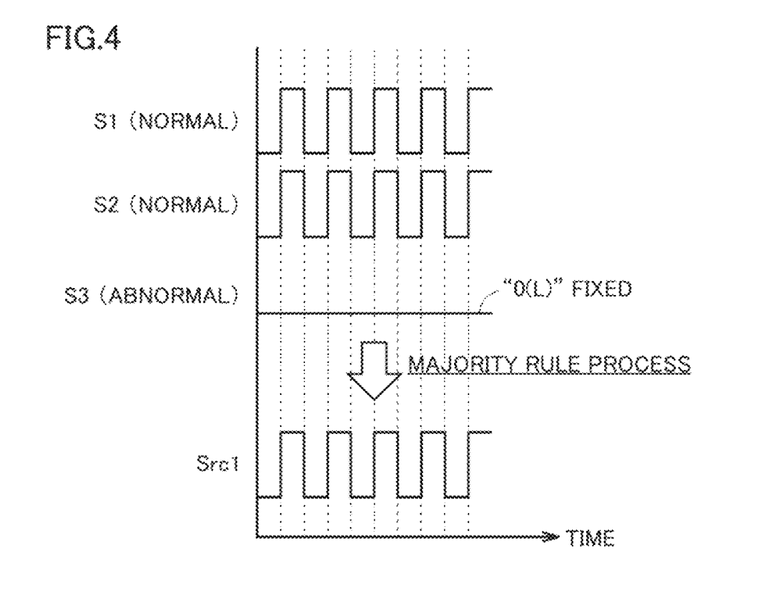
FIG. 4 is a conceptual waveform diagram illustrating a majority rule process for rectangular wave signals in triple redundancy.

FIG. 4 is a conceptual waveform diagram illustrating a majority rule process for rectangular wave signals in triple redundancy.

Referring to FIG. 4, the identical rectangular wave signal Src1 is output to three signal lines 701 to 703. Signal waveforms S1 to S3 are waveforms observed in signal lines 701 to 703, respectively. Signal waveform S1, S2 of signal line 701, 702 repeats a transition between "1 (H level)" and "0 (L level)" in constant periods in accordance with rectangular wave signal Src1 generated by controller 31. On the other hand, in the example in FIG. 4, signal line 703 is disconnected, so that signal waveform S3 is fixed to "0".

Even in this case, rectangular wave signal Src1 can be reproduced by a majority rule process for signal waveforms S1 to S3. The majority rule process can be implemented by employing the majority of the levels ("1" or "0") of signal waveforms S1 to S3 at the same timing.

With this configuration, even when one of triple-redundant signal lines 701 to 703 is disconnected, rectangular wave signal Src1 generated by controller 31 and then transmitted through signal lines 701 to 703 can be read correctly in each of controllers 31 and 32.

Referring to FIG. 1 again, controller 32 outputs the generated rectangular wave signal Src2 to triple-redundant signal lines 704 to 706, similarly. Rectangular wave signal Src2 output to signal lines 704 to 706 is input to both of controllers 31 and 32. With this configuration, rectangular wave signal Src2 generated by controller 32 and then transmitted through signal lines 704 to 706 can be read correctly in each of controllers 31 and 32.

Controllers 31 and 32 can generate drive signals DSG of power converter 50 at the same timing by parallel operation in which their generated rectangular wave signals Src1 and Src2 are synchronized with each other. Such synchronous operation of the main system and the standby system enables recovery to normal operation in a short time in the switching operation between the main system and the standby system at the time of abnormality detection due to a failure or the like.

Figure 5:
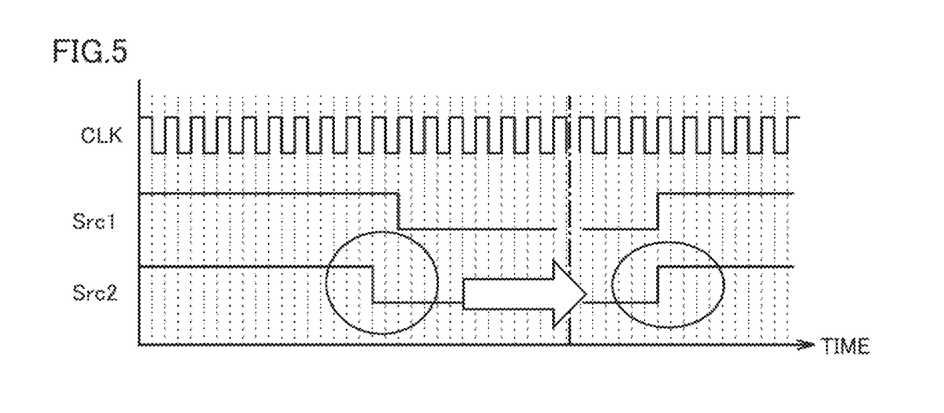
FIG. 5 is a conceptual waveform diagram illustrating synchronous control between rectangular wave signals generated by the controllers of a main system and a standby system.

FIG. 5 shows a conceptual waveform diagram illustrating synchronous control of rectangular wave signals Src1 and Src2. In FIG. 5, the control of rectangular wave signal Src2 in controller 32 is shown by way of example.

Referring to FIG. 5, rectangular wave signals Src1 and Src2 are obtained in the majority rule process illustrated in FIG. 4. Each of controllers 31 and 32 operates in synchronization with an internal basic clock signal CLK. Basic clock signal CLK is generated by an oscillator (for example, quarts oscillator) contained in each of controllers 31 and 32. The period of rectangular wave signal Src1, Src2 is an integer multiple of the period of basic clock signal CLK.

For example, when a difference in frequency of basic clock signal CLK occurs between controllers 31 and 32 due to individual difference of oscillators, the operation timings of controllers 31 and 32 shift from each other. In such a case, a phase difference may occur between rectangular wave signals Src1 and Src2 generated by controllers 31 and 32, respectively.

In FIG. 5, the frequency of basic clock signal CLK of controller 32 is higher than that of the basic clock signal (not shown) of controller 31, so that the phase of rectangular wave signal Src2 generated by controller 32 is ahead of rectangular wave signal Src1 generated by controller 31 by one clock cycle.

Controller 32 therefore can perform synchronous control of rectangular wave signals Src1 and Src2 by detecting the phase difference from rectangular wave signal Src1 at the falling timing of rectangular wave signal Scr2 and adjusting the falling timing of rectangular wave signal Scr2 in accordance with the detected phase difference (here, delaying one clock cycle). Alternatively, conversely, the phase difference may be detected at the rising timing of rectangular wave signal Src2 and the next falling timing may be adjusted.

Controller 31 also has a similar function and can perform synchronous control of rectangular wave signals Src1 and Src2 by adjusting the phase of rectangular wave signal Src1 in accordance with the phase difference between rectangular wave signals Src1 and Src2. Such synchronous control can match the operation timings of controllers 31 and 32.

Abnormality detection by mutual monitoring of controllers 31 and 32 can be performed through such synchronous control. For example, abnormality of the controller can be detected when the phase difference between rectangular wave signals Src1 and Src2 detected in synchronous control exceeds a predetermined determination value.

Figure 6:
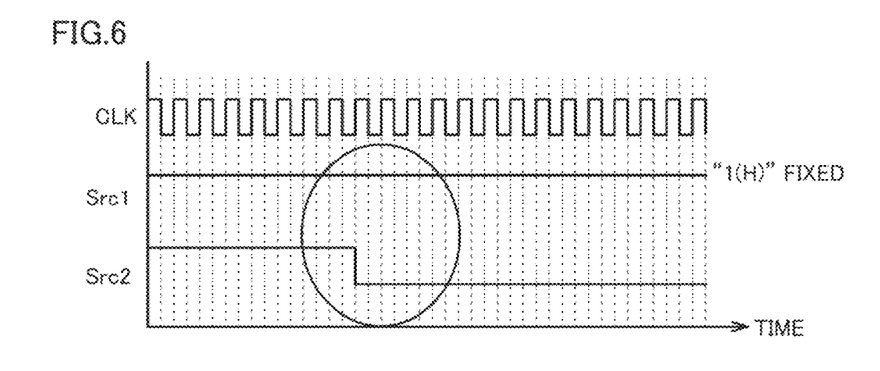
FIG. 6 is a waveform diagram of rectangular wave signals at occurrence of abnormality in the controller.

FIG. 6 shows a waveform example of rectangular wave signals at occurrence of abnormality of the controller.

Referring to FIG. 6, an abnormality example in which abnormality occurs in controller 31 and rectangular wave signal Src1 is fixed to "1 (H level)" is shown.

Thus, in controller 32, a phase difference between rectangular wave signals Scr2 and Scr1 that is detected at the falling timing of rectangular wave signal Src2 is greater than a determination value. Thus, controller 32 (abnormality detector 720) can detect the abnormality of controller 31. In response, abnormality detector 720 changes abnormality detection signal Sab1 (FIG. 2) input to system selector 60 from "0" to "1".

Similarly, on the controller 31 side, abnormality monitoring of controller 32 can be performed based on a phase difference detected between rectangular wave signals Src1 and Src2. When the phase difference of rectangular wave signal Src2 with respect to rectangular wave signal Src1 that is detected in synchronous control is greater than a determination value, controller 31 (abnormality detector 710) changes abnormality detection signal Sab2 (FIG. 2) input to system selector 60 from "0" to "1".

Abnormality detection signal Sab1, Sab2 in abnormality detection is preferably a one-shot pulse signal in which "1" has a short pulse width so that the possibility that "1" is fixed due to some failure is low.

In this way, controllers 31 and 32 can perform synchronous control such that they operate at the same timing to generate drive signals DSG by comparison of their generated rectangular wave signals Src1 and Src2. Furthermore, the abnormality monitoring function of controllers 31 and 32 can be implemented by mutual monitoring of rectangular wave signals Src1 and Src2 used in the synchronous control.

The synchronous control in controller 32 is performed using rectangular wave signal Src1 obtained by the majority rule process for signal waveforms transmitted from controller 31 to controller 32 through signal lines 701 to 703 and rectangular wave signal Src2 obtained by the majority rule process for signal waveforms reinput to controller 32 after transmission through signal lines 704 to 706. Similarly, the synchronous control in controller 31 is performed using rectangular wave signal Src2 obtained by the majority rule process for signal waveforms transmitted from controller 32 to controller 31 through signal lines 704 to 706 and rectangular wave signal Src1 obtained by the majority rule process for signal waveforms reinput to controller 31 after transmission through signal lines 701 to 703.

With this configuration, even when one signal line among triple-redundant signal lines 701 to 703 or 704 to 706 is disconnected, the synchronous control can be performed accurately by the majority rule process. Furthermore, in each of controllers 31 and 32, wiring delay of signal transmission between controllers 31 and 32 (signal lines 701 to 706) and delay in signal acquisition process occur equivalently in both of rectangular wave signals Src1 and Src2. As a result, false recognition of these delays as a phase difference is prevented, and synchronous control of controllers 31 and 32 as well as abnormality monitoring of controllers 31 and 32 can be performed accurately.

In FIG. 4 to FIG. 6, synchronous control and abnormality monitoring of controllers 31 and 32 using a rectangular wave signal with a constant frequency have been described. However, the rectangular wave signal can be a signal including a low frequency signal and a high frequency signal, and the timing to correct a phase difference and the timing to perform abnormality monitoring can be separated.

Figure 7:
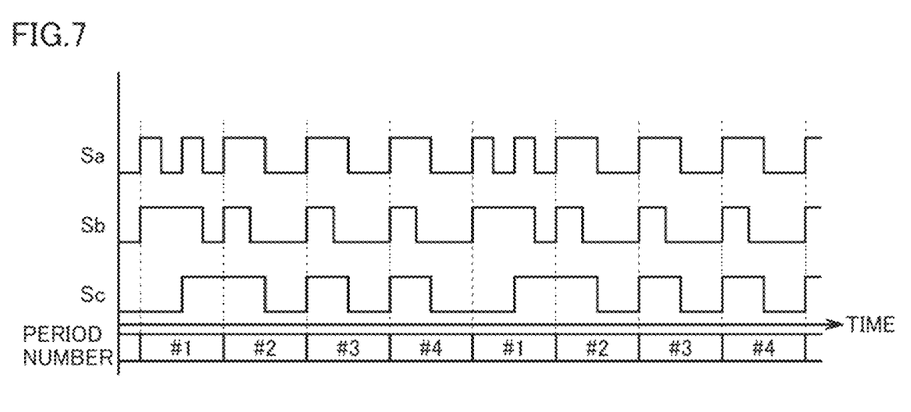
FIG. 7 is a conceptual waveform diagram illustrating a modification of rectangular wave signals used in synchronous control and abnormality detection of the controller.

FIG. 7 is a conceptual waveform diagram illustrating a modification of rectangular wave signals used in synchronous control and abnormality detection of the controllers.

Referring to FIG. 7, each of rectangular wave signals Sa to Sc can be used in place of rectangular wave signals Src1 and Src2. That is, for example, controller 31 can generate rectangular wave signal Src1 in accordance with rectangular wave signal Sa, in place of a rectangular wave signal with a constant frequency, and controller 32 can generate rectangular wave signal Src2 in accordance with rectangular wave signal Sa, in place of a rectangular wave signal with a constant frequency. Also in this case, synchronous control and abnormality detection of controllers 31 and 32 described above can be performed by comparison between rectangular wave signal Src1 transmitted through signal lines 701 to 703 and rectangular wave signal Src2 transmitted through signal lines 704 to 706.

Each of rectangular wave signals Sa to Sc includes a low frequency signal and a high frequency signal, and the phase difference correction timing and the abnormality detection timing are divided using a single signal.

Specifically, rectangular wave signal Sa is generated such that it includes a low frequency signal having a period four times longer than that of a high frequency signal by making a change to a high frequency signal generated in each of period numbers #1 to #4 every four periods and changing the frequency in each period number #1. In this case, phase difference correction is performed in period number #1, while abnormality detection can be performed in each of period numbers #1 to #4.

Similarly, rectangular wave signal Sb is generated such that it includes a low frequency signal having a period four times longer than that of a high frequency signal by making a change to a high frequency signal generated in each of period numbers #1 to #4 and changing the duty ratio in each period number #1. Rectangular wave signal Sc can be a signal including both of a low frequency signal and a high frequency signal by changing the phase difference in each period number #1.

In this way, with the use of a single rectangular wave signal including both of a low frequency signal and a high frequency signal as illustrated in FIG. 7, abnormality detection is accelerated in accordance with the periods of the high frequency signal, while phase adjustment for ensuring synchronization can be performed by using a low frequency signal to ensure the resolution of phases.

In the first embodiment, signal lines 701 to 703, 704 to 706 are configured in triple redundancy. However, a similar majority rule process may be performed to make a four or more multiple redundant configuration. In the first embodiment, signal lines 701 to 703 correspond to an embodiment of "first signal line", and signal lines 704 to 706 correspond to an embodiment of "second signal line". Rectangular wave signal Src1 corresponds to an embodiment of "first rectangular wave signal", and rectangular wave signal Src2 corresponds to an embodiment of "second rectangular wave signal".

As described above, in power conversion device 1A according to the first embodiment, the redundancy is ensured efficiently by selectively using controllers 31 and 32 operating in parallel as the main system and the standby system, and then a desired power supply to load 5 can be continued in response to a single failure in A/D converter 11, control selector 21, controllers 31 and 32, output selector 40, power converter 50, and system selector 60. With this configuration, for example, even when power conversion device 1A is mounted on an artificial satellite that is unable to be repaired once launched, power supply to load 5 that is a component of the artificial satellite can be maintained in response to occurrence of a single failure.

Second Embodiment

In a second embodiment, a configuration example in which a plurality of detection values (analog voltages) from sensor 3 (FIG. 1) are input to control device 80 will be described.

Figure 8:
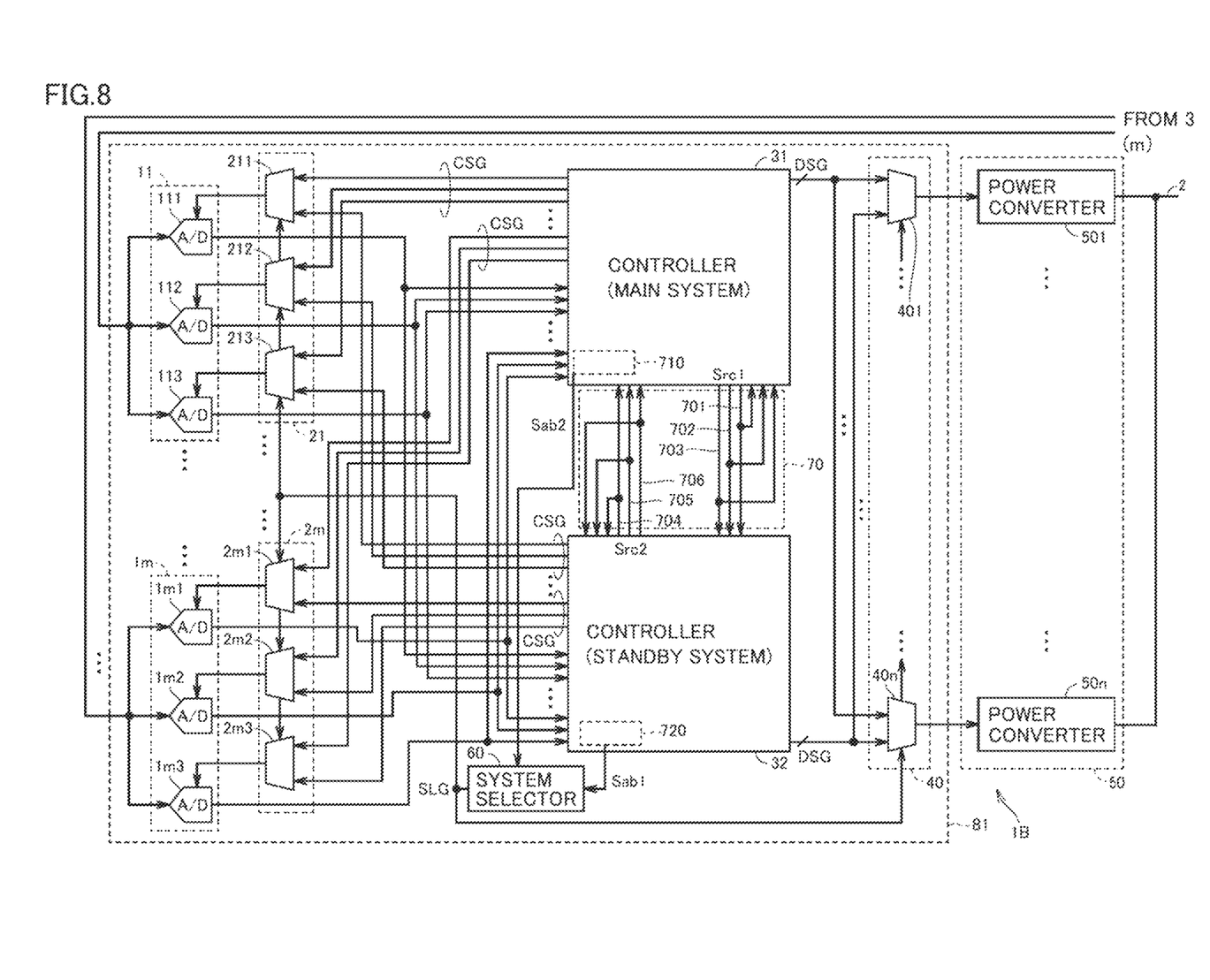
FIG. 8 is a block diagram illustrating a configuration of a power conversion device according to a second embodiment of the present disclosure.

FIG. 8 is a block diagram illustrating a configuration of a power conversion device 1B according to the second embodiment.

Referring to FIG. 8, power conversion device 1B according to the second embodiment differs from power conversion device 1A in FIG. 1 in that m (m is a natural number equal to or greater than 2) A/D converters 11 to 1m are provided and that m control selectors 21 to 2m are provided corresponding to A/D converters 11 to 1m, respectively. The other configuration of power conversion device 1B is similar to that of power conversion device 1A according to the first embodiment and will not be further elaborated.

In FIG. 8 and the subsequent drawings, load 5 is not illustrated, but even in the second and subsequent embodiments, power converters 501 to 50n are connected in common to power bus 2 and thereby connected in parallel to load 5 (FIG. 1). In the second and subsequent embodiments, the manner of connection of power converters 501 to 50n and load 5 is similar to that of the first embodiment.

The number in of A/D converters 11 to 1m arranged in the second embodiment is equal to the number of detection values input from sensor 3 (FIG. 1) to control device 80.

In power conversion device 1B, therefore, A/D converter 11 and control selector 21 in the first embodiment (power conversion device 1A) is arranged for each of in detection values (analog voltages) input to control device 80.

Each of A/D converters 11 to 1m is composed of triple redundancy similar to A/D converter 11 in FIG. 1. For example, A/D converter 11 is composed of three A/D converters 111 to 113 similar to those in FIG. 1, and mth A/D converter 1m is composed of three A/D converters 1m1 to 1m3. As described in the first embodiment, each of A/D converters 11 to 1m and each of control selectors 21 to 2m can be configured in triple redundancy similar to that in FIG. 1, but the number of redundancy may be increased to four or more.

Similarly, control selector 21 is composed of three control selectors 211 to 213, and mth control selector 2m is composed of three control selectors 2m1 to 2m3. All of control selectors 211 to 213, . . . , 2m1 to 2m3 that constitute control selectors 21 to 2m selectively output one of control signal CSG from controller 31 and control signal CSG from controller 32, in accordance with select signal SLG from system selector 60 similar to that of the first embodiment.

Thus, control signal CSG generated by the controller of the main system of controllers 31 and 32 is input to all of A/D converters 111 to 113, . . . , 1m1 to 1m3 that constitute A/D converters 11 to 1m. That is, the operation of A/D converters 11 to 1m can be controlled by control signal CSG generated by the controller of the main system.

In this way, in the power conversion device according to the second embodiment, a redundant configuration similar to the first embodiment can be employed in the input path of the analog detection value to controllers 31 and 32 in a configuration in which a plurality of detection values (analog voltages) related to the output of power converter 50 are input from sensor 3 (FIG. 1) provided on power bus 2.

With this configuration, for occurrence of a single failure in each of A/D converters 11 to 1m or control selectors 21 to 2m for handling m detection values, the correct detection values can be input to each of controllers 31 and 32. As a result, a desired power supply to load 5 can be continued in response to a single failure in each of A/D converters 11 to 1m, each of control selectors 21 to 2m, controllers 31 and 32, output selector 40, power converter 50, and system selector 60, in the same manner as in the first embodiment.

Modification to Second Embodiment

Figure 9:
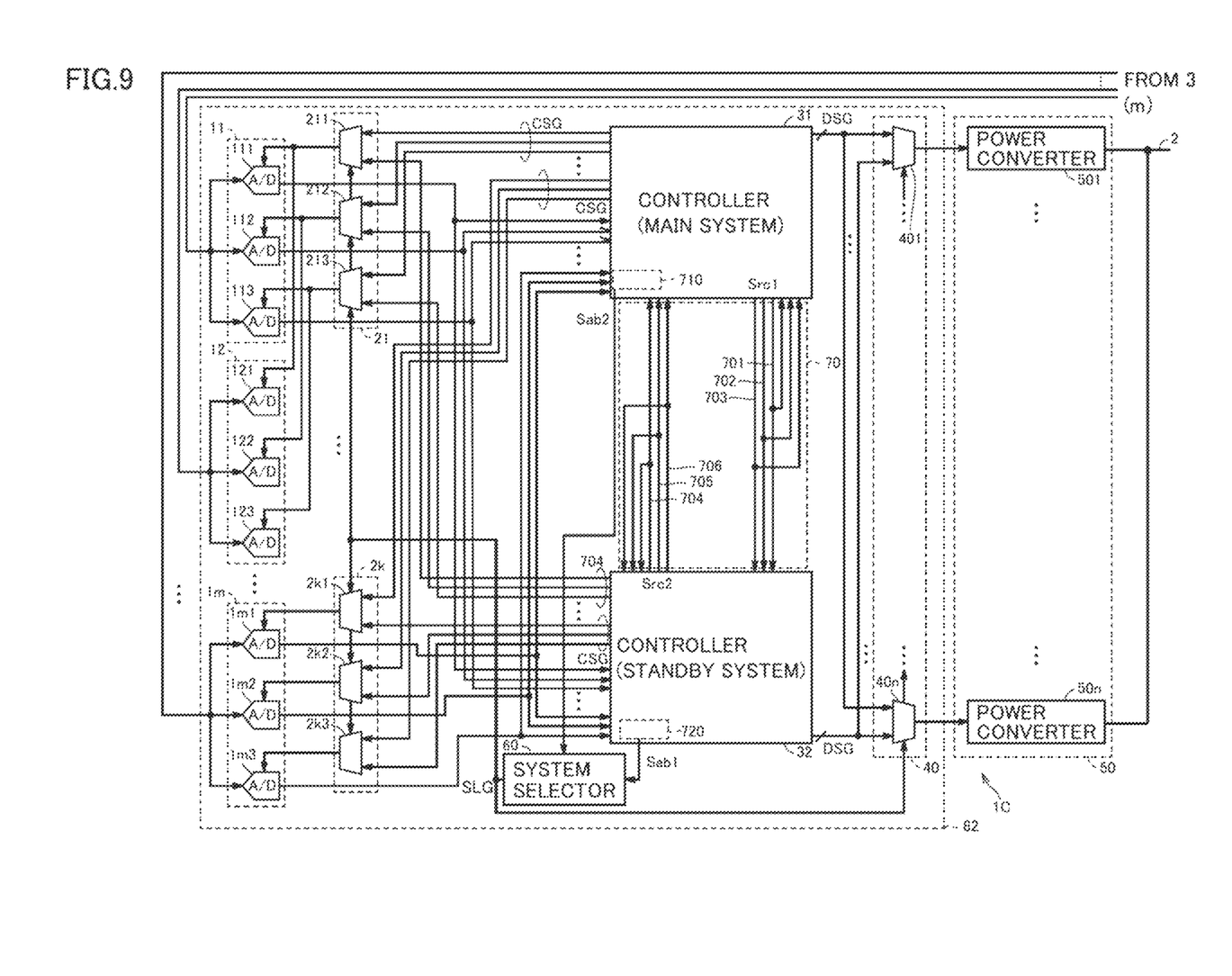
FIG. 9 is a block diagram illustrating a configuration of a power conversion device according to a modification to the second embodiment of the present disclosure.

FIG. 9 is a block diagram illustrating a configuration of a power conversion device 1C according to a modification to the second embodiment.

Referring to FIG. 9, power conversion device 1C according to the modification to the second embodiment differs from power conversion device 1B in FIG. 8 in that k (k is a natural number smaller than m) control selectors 21 to 2k are provided for m (m is a natural number equal to or greater than 2) A/D converters 11 to 1m. The other configuration of power conversion device 1C is similar to that of power conversion device 1B according to the second embodiment and will not be further elaborated.

In power conversion device 1C, a control signal from a common control selector is supplied to a plurality of A/D converters operable with a common control signal among m A/D converters 11 to 1m.

For example, in the example in FIG. 9, A/D converter 11 (A/D converters 111 to 113) and A/D converter 12 (A/D converters 121 to 123) are operable with a common control signal and can receive supply of control signal CSG generated by the controller of the main system from common control selector 21 (control selectors 211 to 213).

The value of k, that is, the number of control selectors 21 to 2k arranged depends on the number of A/D converters controllable with a common control signal among m A/D converters 11 to 1m. Most ideally, when each of A/D converters 11 to 1m is controllable with a common control signal, control signal CSG from the controller of the main system can be supplied to all of A/D converters 11 to 1m by single control selector 21, where k=1.

Third Embodiment

In a third embodiment, a modification of synchronous control and abnormality detection of controllers 31 and 32 will be described.

Figure 10:
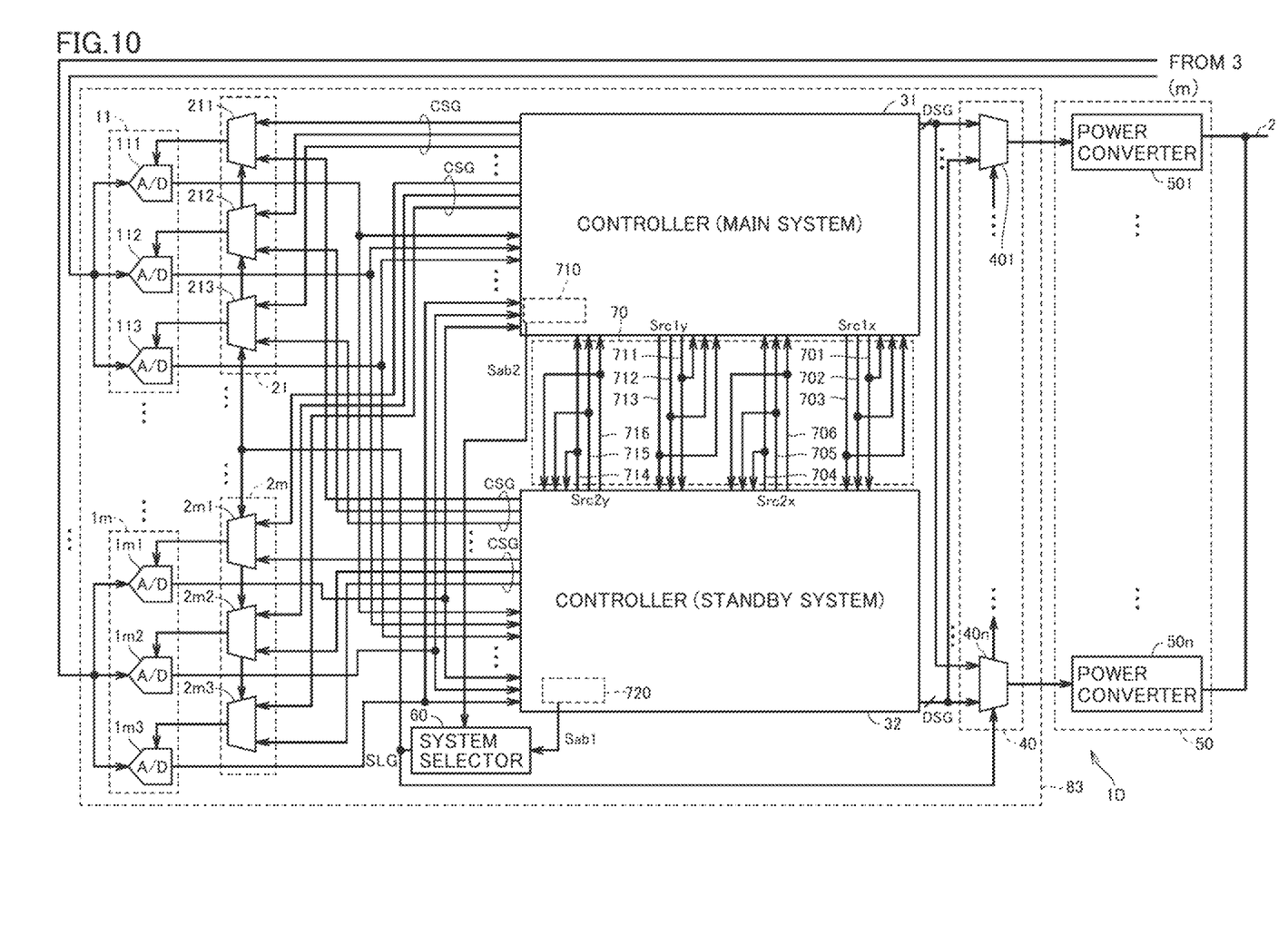
FIG. 10 is a block diagram illustrating a configuration of a power conversion device according to a third embodiment of the present disclosure.

FIG. 10 is a block diagram illustrating a configuration of a power conversion device 1D according to the third embodiment.

Referring to FIG. 10, power conversion device 1D according to the third embodiment differs from power conversion device 1B in FIG. 8 in that controllers 31 and 32 generate two kinds of rectangular wave signals with different frequencies. In response, abnormality detection signal line 70 further includes signal lines 711 to 716, in addition to signal lines 701 to 706.

Controller 31 generates rectangular wave signals Src1x and Src1y with different frequencies. Each of rectangular wave signals Src1x and Src1y is a signal with a constant frequency similar to rectangular wave signal Src1 described in the first embodiment, but the frequency fy of rectangular wave signal Src1y is set to be higher than the frequency fx of rectangular wave signal Src1x.

Controller 32 generates rectangular wave signals Src2x and Src2y with different frequencies. The characteristics of rectangular wave signals Src2 and Src2y are similar to rectangular wave signals Src1x and Src1y. Rectangular wave signals Src2x and Src2y are therefore generated such that they have frequencies fx and fy.

Rectangular wave signal Src1x is output from controller 31 to signal lines 701 to 703 and transmitted to controller 32 and reinput to controller 31. Rectangular wave signal Src2x is output from controller 32 to signal lines 704 to 706 and transmitted to controller 31 and reinput to controller 32. The majority rule process is performed for the signal waveforms (rectangular wave signal Src1x) of signal lines 701 to 703 and the signal waveforms (rectangular wave signal Src2x) of signal lines 704 to 706, in the same manner as described in the first embodiment.

Similarly, rectangular wave signal Src1y is output from controller 31 to signal lines 711 to 713 and transmitted to controller 32 and reinput to controller 31. Rectangular wave signal Src2y is output from controller 32 to signal lines 714 to 716 and transmitted to controller 31 and reinput to controller 32. The majority rule process is also performed for the signal waveforms (rectangular wave signal Src2x) of signal lines 711 to 713 and the signal waveforms (rectangular wave signal Src2y) of signal lines 714 to 716, in the same manner as described in the first embodiment.

As a result, each of rectangular wave signals Src1x and Scr2x is delayed equivalently and then input to both of controllers 31 and 32, in the same manner as rectangular wave signals Src1 and Src2 in the first embodiment. Each of rectangular wave signals Src1y and Scr2y is also delayed equivalently and then input to both of controllers 31 and 32.

Controllers 31 and 32 perform synchronous control of controllers 31 and 32 described in the first embodiment, based on the phase comparison after the majority rule process for rectangular wave signals Scr1x and Scr2x with a low frequency. On the other hand, controllers 31 and 32 (abnormality detectors 710 and 720) perform abnormality detection of controllers 31 and 32 described in the first embodiment, based on the phase comparison after the majority rule process for rectangular wave signals Scr1y and Scr2y with a high frequency.

In power conversion device 1D according to the third embodiment, the configuration is similar to power conversion device 1B (second embodiment) except for synchronous control and abnormality detection of controllers 31 and 32 and will not be further elaborated. In the third embodiment, signal lines 701 to 703 correspond to an embodiment of "first signal line", signal lines 711 to 713 correspond to an embodiment of "second signal line", signal lines 704 to 706 correspond to an embodiment of "third signal line", and signal lines 714 to 716 correspond to an embodiment of "fourth signal line". Rectangular wave signal Src1x corresponds to an embodiment of "first rectangular wave signal", rectangular wave signal Src1y corresponds to an embodiment of "second rectangular wave signal", rectangular wave signal Src2x corresponds to an embodiment of "third rectangular wave signal", and rectangular wave signal Src2y corresponds to an embodiment of "fourth rectangular wave signal".

In power conversion device 1D according to the third embodiment, the following effects can be achieved in addition to the effects similar to those in power conversion device 1B according to the second embodiment.

Specifically, since abnormality detection of controllers 31 and 32 can be performed with a frequency higher than the frequency of the rectangular wave signals for synchronous control, abnormality can be detected promptly at occurrence of a failure in controller 31 or 32. On the other hand, for the synchronous control, the phases are compared between rectangular wave signals with a relatively low frequency, so that the resolution of phase adjustment for ensuring synchronization can be ensured. In FIG. 10, an example in which the abnormality detection according to the third embodiment is combined with the second embodiment (power conversion device 1B in FIG. 8) has been described. However, the abnormality detection according to the third embodiment may be combined with the first embodiment (power conversion device 1A in FIG. 1) or the modification to the second embodiment (power conversion device 1C in FIG. 9).

In the present embodiment, a configuration example in which controllers 31 and 32 exchange their generated rectangular wave signals to mutually monitor abnormality occurrence has been described. However, the abnormality monitoring of controllers 31 and 32 may be implemented by any method other than this configuration example. For example, instead of the rectangular wave signals, serial communication may be performed between controllers 31 and 32 and abnormality detection may be performed at occurrence of abnormality in the serial communication.

Alternatively, an abnormality detector that outputs similar abnormality detection signals Sab1 and Sab2 to system selector 60 may be arranged as an element external to controllers 31 and 32. In this case, the abnormality detector may monitor a signal transmitted from controllers 31 and 32 and, when transmission of the signal is stopped due to a failure or the like, determine abnormality and output abnormality detection signals Sab1 and Sab2.

When the abnormality detector is provided as an element external to controllers 31 and 32, the abnormality detector may be arranged not only in the inside of the power conversion device but also in the outside of the power conversion device so that abnormality monitoring of controllers 31 and 32 is performed from the outside of the power conversion device. In this case, abnormality detection signals Sab1 and Sab2 are input from the outside of the power conversion device and input to system selector 60.

In FIG. 1, the number n of power converters 50 is n≥2. However, the configuration of the power conversion device according to the present embodiment can be implemented without limiting the number (n) of power converters 50. That is, in the configuration in FIG. 1, even with n=1, the redundancy of controllers is ensured with parallel operation of controllers 31 and 32, and then a desired power supply to load 5 by power converter 50 (n=1) can be continued even when a single failure occurs in controller 31 or 32.

For the redundant configuration of controllers according to the present embodiment, at least two controllers (controllers 31 and 32) need to be arranged, but controllers may be further provided such that three or more (J) controllers operate in parallel. Also in this case, system selector 60 selects one of J controllers, and control selector 21 and output selector 40 selectively output control signal CSG and drive signal DSG from one controller among J controllers, in accordance with an instruction (select signal SLG) from system selector 60, whereby a similar redundant configuration can be implemented.

Embodiments disclosed here should be understood as being illustrative rather than being limitative in all respects. The technical scope of the present disclosure is shown not in the foregoing description but in the claims, and it is intended that all modifications that come within the meaning and range of equivalence to the claims are embraced here.

REFERENCE SIGNS LIST 1A to 1D power conversion device
2 power bus, 3 sensor, 5 load, 11 to 1$m$, 111 to 113, 121, 123, 1$m$1 to 1$m$3 A/D converter, 21 to 2$m$, 211 to 213, 2$k$1 to 2$k$3, 2$m$1 to 2$m$3 control selector, 31, 32 controller, 35 signal processing system, 40, 401 to 40$n$ output selector, 50, 501 to 50$n$ power converter, 60 system selector, 61, 62 edge detection circuit, 65 latch circuit, 70 abnormality detection signal line, 80 control device, 151 to 154, 701 to 706, 711 to 716 signal line, 310 adder, 311 to 313, 355 multiplier, 321 to 323, 350 subtractor, 331 to 333 absolute value calculator, 340 maximum value extractor, 345 selector, 710, 720 abnormality detector, CSG control signal, CLK basic clock signal, Dx detection value (digital value), DSG drive signal, Dsm sum value, Dx1 to Dx3 digital value, SLG select signal, Sab1, Sab2 abnormality detection signal.

The invention claimed is:
1. A power conversion device comprising:
   n (n is a natural number equal to or greater than 1) power converters each operating in accordance with a drive signal to generate a power to be supplied to a load;
   a signal converter having a redundant configuration in which L (L is a natural number equal to or greater than 3) analog-to-digital converters to convert an analog detection value from the power converters into digital values are arranged in parallel;
   first and second controllers operating in parallel,
   wherein each of the first and second controllers generates the drive signal using the digital values from the analog-to-digital converters;
   a system selector to select one of the first and second controllers in accordance with an abnormality detection result of the first and second controllers; and
   n output selectors provided corresponding to the n power converters, respectively,
   wherein each of the output selectors receives the drive signals from both of the first and second controllers and outputs the drive signal from one controller selected by the system selector from the first and second controllers, to one corresponding power converter among the n power converters.
2. The power conversion device according to claim 1, wherein
   each of the first and second controllers generates a control signal of the analog-to-digital converters, and
   the power conversion device further comprises a control selector to receive the control signals from both of the first and second controllers and output the control signal from the one controller to the signal converter.
3. The power conversion device according to claim 2, wherein
   m (m is a natural number equal to or greater than 2) analog detection values are detected, and
   the signal converter and the control selector are arranged corresponding to each of the m analog detection values.
4. The power conversion device according to claim 2, wherein
   m (m is a natural number equal to or greater than 2) analog detection values are detected, m signal converters are provided corresponding to the m analog detection values, respectively, k (k is a natural number smaller than m) control selectors are provided, where k is less than the m, and at least some of the k control selectors output a common control signal to a plurality of the signal converters.

5. The power conversion device according to claim 1, wherein the power conversion device further comprises a first signal line and a second signal line at least triple-redundant and connected between the first and second controllers, the first controller outputs a first rectangular wave signal to the first signal line, the second controller outputs a second rectangular wave signal to the second signal line, the first controller performs synchronous control with the second controller and detects abnormality of the second controller, based on phase comparison between the first rectangular wave signal obtained by a majority rule process for signal waveforms of the first signal line and the second rectangular wave signal obtained by a majority rule process for signal waveforms of the second signal line, and the second controller performs synchronous control with the first controller and detects abnormality of the first controller, based on phase comparison between the second rectangular wave signal obtained by a majority rule process for signal waveforms of the second signal line and the first rectangular wave signal obtained by a majority rule process for signal waveforms of the first signal line.

6. The power conversion device according to claim 1, wherein the power conversion device further comprises a first signal line, a second signal line, a third signal line, and a fourth signal line at least triple-redundant and connected between the first and second controllers, the first controller outputs a first rectangular wave signal to the first signal line and outputs a second rectangular wave signal with a frequency higher than a frequency of the first rectangular wave signal to the second signal line, the second controller outputs a third rectangular wave signal to the third signal line and outputs a fourth rectangular wave signal with a frequency higher than a frequency of the first rectangular wave signal to the fourth signal line, the first controller performs synchronous control with the second controller, based on phase comparison between the first rectangular wave signal obtained by a majority rule process for signal waveforms of the first signal line and the third rectangular wave signal obtained by a majority rule process for signal waveforms of the third signal line, and detects abnormality of the second controller, based on phase comparison between the second rectangular wave signal obtained by a majority rule process for signal waveforms of the second signal line and the fourth rectangular wave signal obtained by a majority rule process for signal waveforms of the fourth signal line, and the second controller performs synchronous control with the first controller, based on phase comparison between the third rectangular wave signal obtained by a majority rule process for signal waveforms of the third signal line and the first rectangular wave signal obtained by a majority rule process for signal waveforms of the first signal line, and detects abnormality of the first controller, based on phase comparison between the fourth rectangular wave signal obtained by a majority rule process for signal waveforms of the fourth signal line and the second rectangular wave signal obtained by a majority rule process for signal waveforms of the second signal line.

7. The power conversion device according to claim 1, wherein the system selector selects the one controller, based on a first abnormality detection signal set to a different level depending on whether abnormality of the first controller is detected, and a second abnormality detection signal set to a different level depending on whether abnormality of the second controller is detected, and switching of selection of the one controller by the system selector is performed at a timing when the level of the first or second abnormality detection signal changes.

8. The power conversion device according to claim 1, wherein each of the first and second controllers includes a signal processor provided corresponding to the signal converter, the signal processor receives L digital values from L analog-to-digital converters, extracts two or more and (L−1) or less digital values with a smaller difference from an average value of the L digital values, from among the L digital values, and outputs an average value of the extracted digital values, and each of the first and second controllers performs a control operation process for generating the drive signal, using the average value output by the signal processor.

* * * * *